(12) United States Patent
Xu et al.

(10) Patent No.: US 8,298,467 B2
(45) Date of Patent: *Oct. 30, 2012

(54) METHOD OF LOW TEMPERATURE IMPRINTING PROCESS WITH HIGH PATTERN TRANSFER YIELD

(75) Inventors: Yongan Xu, Philadelphia, PA (US); Hong Yee Low, Singapore (SG)

(73) Assignee: Agency for Science Technology and Research, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/017,976

(22) Filed: Jan. 31, 2011

(65) Prior Publication Data

US 2011/0140305 A1      Jun. 16, 2011

Related U.S. Application Data

(62) Division of application No. 11/355,600, filed on Feb. 16, 2006, now Pat. No. 7,901,607.

(60) Provisional application No. 60/653,923, filed on Feb. 17, 2005.

(51) Int. Cl.
*B28B 3/00* (2006.01)
*A61M 25/00* (2006.01)
*B29C 59/00* (2006.01)

(52) U.S. Cl. ............ 264/297.4; 264/139; 264/162; 264/250; 264/259; 264/264; 264/293; 264/319; 264/320; 264/337; 264/338; 264/483; 977/887

(58) Field of Classification Search ............ None
See application file for complete search history.

(56) References Cited

U.S. PATENT DOCUMENTS

| | | |
|---|---|---|
| 5,269,997 A | 12/1993 | Leslie |
| 5,759,755 A | 6/1998 | Park et al. |
| 5,976,444 A | 11/1999 | Pearson et al. |
| 6,757,116 B1 | 6/2004 | Curtiss et al. |
| 6,949,199 B1 | 9/2005 | Gauzner et al. |
| 6,977,223 B2 | 12/2005 | George et al. |
| 7,309,620 B2 | 12/2007 | Fonash et al. |
| 7,351,346 B2 | 4/2008 | Little |
| 7,901,607 B2 * | 3/2011 | Xu et al. ............ 264/297.4 |
| 2004/0164454 A1 | 8/2004 | Gartstein et al. |
| 2004/0231781 A1 | 11/2004 | Bao et al. |
| 2005/0258570 A1 | 11/2005 | Kong et al. |

FOREIGN PATENT DOCUMENTS

WO      03096123      11/2003

OTHER PUBLICATIONS

Kong et al., "Duo-Mold Imprinting of Three-Dimensional Polymeric Structures," Dec. 2004, J. Vac. Sci. Technology B 22 (6), pp. 3251-3256.

\* cited by examiner

*Primary Examiner* — Jeffrey Wollschlager
(74) *Attorney, Agent, or Firm* — Winstead PC

(57) ABSTRACT

The present invention is directed to novel methods of imprinting substrate-supported or freestanding structures at low cost, with high pattern transfer yield, and using low processing temperature. Such methods overcome many of the above-described limitations of the prior art. Generally, such methods of the present invention employ a sacrificial layer of film.

20 Claims, 10 Drawing Sheets

METHOD OF LOW TEMPERATURE IMPRINTING PROCESS WITH HIGH PATTERN TRANSFER YIELD

RELATED APPLICATIONS

The present application is a divisional application of co-pending U.S. patent application Ser. No. 11/355,600, entitled "Method of Low Temperature Imprinting Process with High Pattern Transfer Yield," filed Feb. 16, 2006, which is incorporated by reference herein. The present application claims priority benefits to U.S. patent application Ser. No. 11/355,600 under 35 U.S.C. §121. U.S. patent application Ser. No. 11/355,600 claims priority under 35 U.S.C. §119(e) to U.S. Provisional Patent Application Ser. No. 60/653,923, filed Feb. 17, 2005 which is incorporated herein by reference.

TECHNICAL FIELD

The present invention relates generally to micro- and nano-imprinting lithography techniques, and specifically to the use of sacrificial layers to form 3-dimensional and multi-layer structures using such techniques.

BACKGROUND INFORMATION

While X-ray, ion beam, and e-beam lithography have all been demonstrated as viable next generation lithography techniques, they are, however, slow and expensive (M. Geissler, Y. Xia, Adv. Mater. 16(15), p. 1249, 2004). Nano-imprinting lithography (NIL) offers a very attractive alternative to the fabrication of sub-micron (i.e., nanometer-scale) features, largely due to the process being simple, fast, and inexpensive, thus making it a potential technique for replacing photolithography in mass production. Although a relatively high yield has been demonstrated, the yield of imprinting relies heavily on a proper tuning of surface energy among the components, i.e., the substrate, the mold, and the polymer. An anti-adhesion layer is almost a prerequisite in NIL processes to ensure that the polymer remains on the substrate during de-molding steps. Accordingly, non-uniformity in the anti-adhesion treatment often results in poor yield (R. W. Jaszewski, H. Schift, B. Schnyder, A. Schneuwly and P. Groning, Appl. Sur. Sci. 143, pp. 301-308, 1999; S. Park, C. Padeste, H. Schift and J. Gobrecht, Microelectronic Eng. 67-68, pp. 252-258, 2003).

Although NIL techniques have successfully demonstrated an ability to fabricate multilayer structures (L. R. Bao, X. Cheng, X. D. Huang, L. J. Guo, S. W. Pang, and A. F. Yee, J. Vac. Sci. Technol. B 20, pp. 2881-2886, 2002; X. D. Huang, L. R. Bao, X. Cheng, L. J. Guo, S. W. Pang, and A. F. Yee, J. Vac. Sci. Technol. B 20(6), pp. 2872-2876, 2002; X. Sun, L. Zhuang, W. Zhang and S. Y. Chou, J. Vac. Sci. Technol B 16(6), pp. 3922-3925, 1998; B. Faircloth, H. Rohrs, R. Ruogg, R. R. Krchnavek, J. Vac. Sci. Technol. B 18(4), pp. 1866-1873, 2000), there are some limitations on the type of structures patternable by these techniques. For instance, it is quite challenging to fabricate such a multilayer structure using NIL, due to difficulties such as: (a) solvent intermixing between layers; (b) deformation of the underlying layer during the imprinting of the top layer due to relatively high temperature and pressure; (c) a requirement that the subsequent layer have a lower $T_g$ than the underlaying layer, in the case of polymeric materials; and (d) limited choice of materials that are imprintable, for instance, in one example, a bilayer or tri-layer resist with different properties are required; in another example, a crosslinked polymer is required to be the underlying layer (Z. Yu, H. Gao, W. Wu, H. Ge and S. Y. Chou, J. Vac. Sci. Technol. B 21(6), pp. 2874-2877, 2003).

While multilayer structures have been demonstrated, as a result of the above-described limitations, the yield is typically very low and the types of polymer used in the layers is quite limited. Accordingly, an improved method of NIL capable of making multi-layer structures in high yield, and with minimal material restrictions, would be highly desirable.

BRIEF DESCRIPTION OF THE INVENTION

In some embodiments, the present invention is directed to novel methods of imprinting substrate-supported or free-standing structures at low cost, with high pattern transfer yield, and using low processing temperature. Such methods overcome many of the above-described limitations of the prior art. Generally, such methods of the present invention employ a sacrificial layer or film.

In some embodiments, the present invention is directed to the use of sacrificial films in duo-mold imprinting, hot-embossing lithography (HEL) or nano-imprinting lithography (NIL), and mold-assisted lithography (MAL) or step-and-flash imprint lithography (SFIL). The combined used of sacrificial films with these techniques serves to improve these techniques in a novel and non-obvious manner.

In accordance with some embodiments of the present invention, utilization of a sacrificial film is illustrated by the following steps: (a) treating a patterned silicon mold, the mold comprising patterned trenches, with a low surface energy silane; (b) depositing polymer having a glass transition temperature ($T_g$) into the mold such that it fills in the trenches and forms a patterned (structured) polymeric thin film in the patterned silicon mold, wherein the patterned polymeric thin film comprises a planarized top surface and a patterned bottom surface that adopts a patterned imprint structure where it conformally contacts the mold; (c) providing a sacrificial film having a surface energy higher than that of the patterned silicon mold and pressing the sacrificial film into the planarized top surface of the polymeric thin film at a temperature above the $T_g$ of the polymer so as to form an assembly; and (d) separating the sacrificial film from the assembly at a temperature below the $T_g$ of the polymer such that the patterned polymeric thin film adheres to the sacrificial film on separation and forms a sacrificial film-supported patterned polymeric thin film. The sacrificial film-supported patterned polymeric thin film can then be transferred to a substrate and the sacrificial film and/or residual polymer between the structures of the patterned polymeric thin film can be removed so as to yield discrete polymeric structures. Using such methods, 3-dimensional and multi-layer structures can be fabricated.

By utilizing a sacrificial film, the present invention offers a number of advantages. First, the pattern transfer yield during the demolding process is significantly improved. The entire pattern, supported on the sacrificial film, can be transferred to a target substrate with subsequent removal of the sacrificial film. This provides a near 100% pattern transfer yield. Second, the pattern transfer from the sacrificial film can be carried out at milder temperatures and pressures, assisted by the conformal nature of the sacrificial film. This advantage enables the imprinting of a multilayer structure comprising a single type of material, thereby broadening the choice of polymers for multilayer structures and allowing for easy preparation of freestanding 3-D structures. Third, this technique is applicable to either or both conventional and reverse imprinting methods by using a sacrificial film such as aluminum foil. The sacrificial film is typically inexpensive, thus adding to the benefit of a low cost nanofabrication process for mass production.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

In the following description, specific details are set forth such as specific quantities, sizes, etc. to provide a thorough understanding of the present invention. However, it will be obvious to those skilled in the art that the present invention may be practiced without such specific details. In many cases, details concerning such considerations and the like have been omitted inasmuch as such details are not necessary to obtain a complete understanding of the present invention and are within the skills of persons of ordinary skill in the relevant art.

In some embodiments, the present invention is directed to a method of low temperature imprinting using a sacrificial film, the method having high transfer yield. This sacrificial film can be inorganic or organic material that can easily be removed by simple wet etching techniques. By using such a sacrificial film, a near 100% imprinting transfer yield can be achieved, and freestanding structures can easily be obtained, even at low process temperatures.

Figure 1:
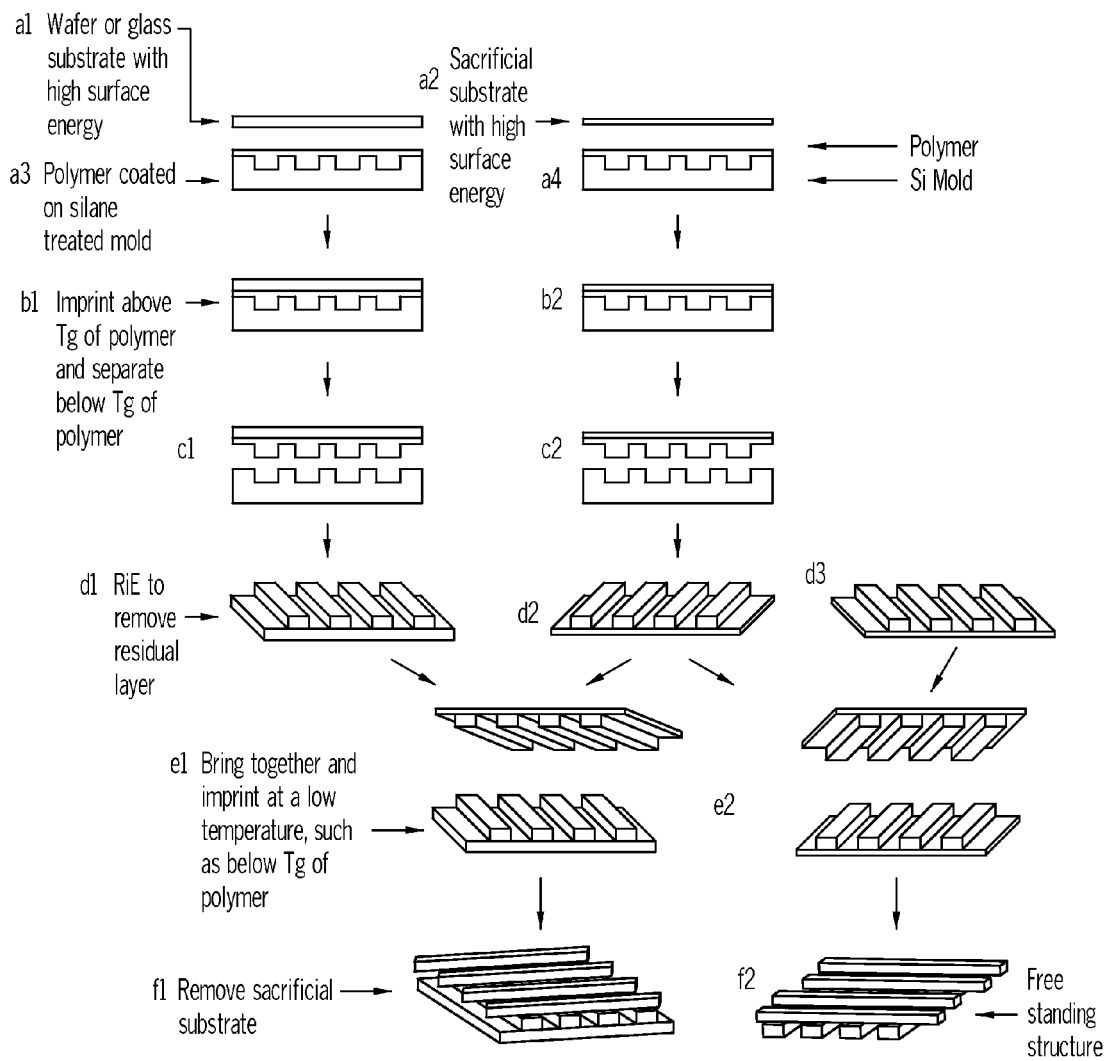
FIG. 1 is a schematic illustrating an imprinting process, according to an embodiment of the present invention, where the process uses a sacrificial substrate.
Figure 2:
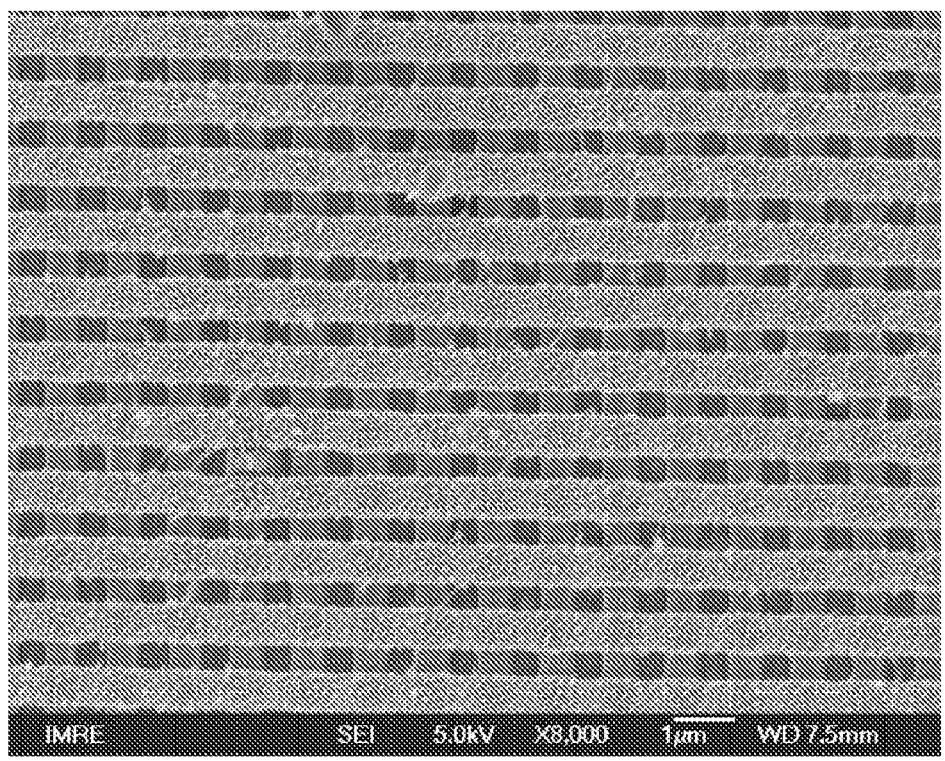
FIG. 2 is an SEM image of a bi-layer PMMA structure with 500 nm wide grating structures on both the top and bottom layer.
Figure 3:
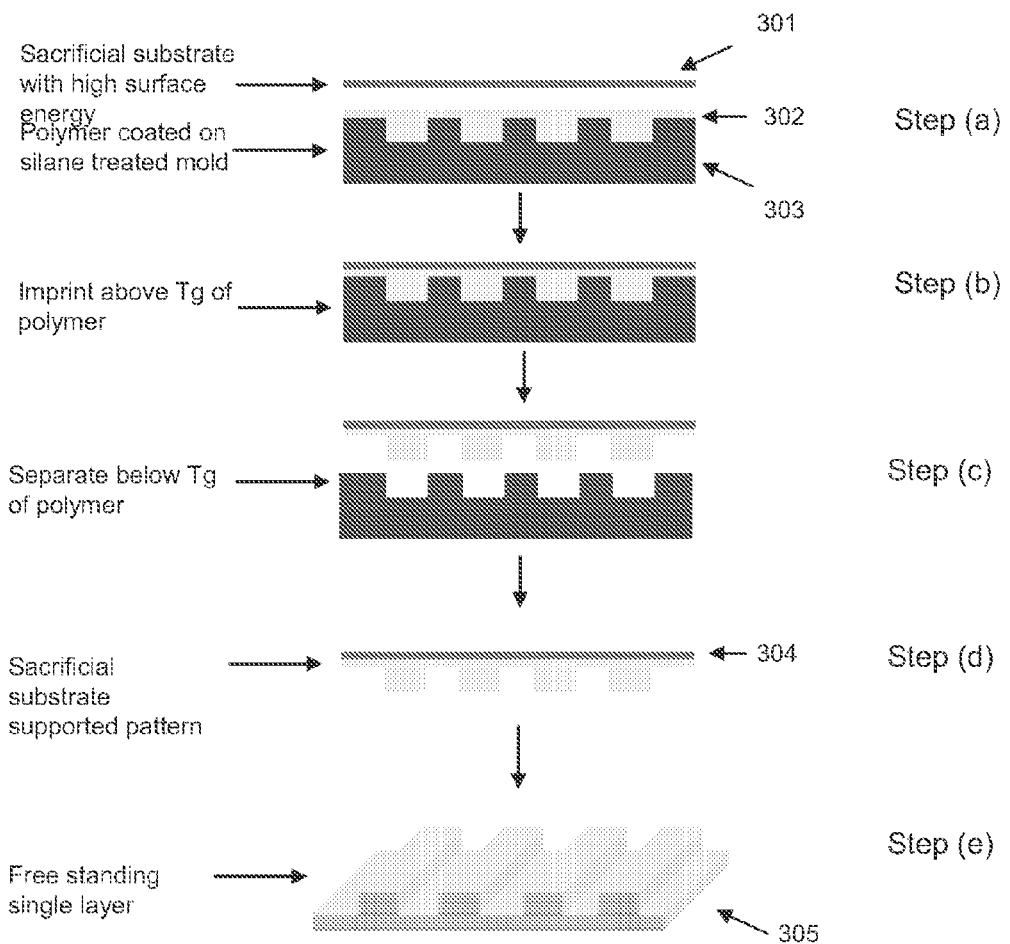
FIG. 3 schematically illustrates fabrication of a freestanding single layer, in accordance with an embodiment of the present invention.
Figure 4:
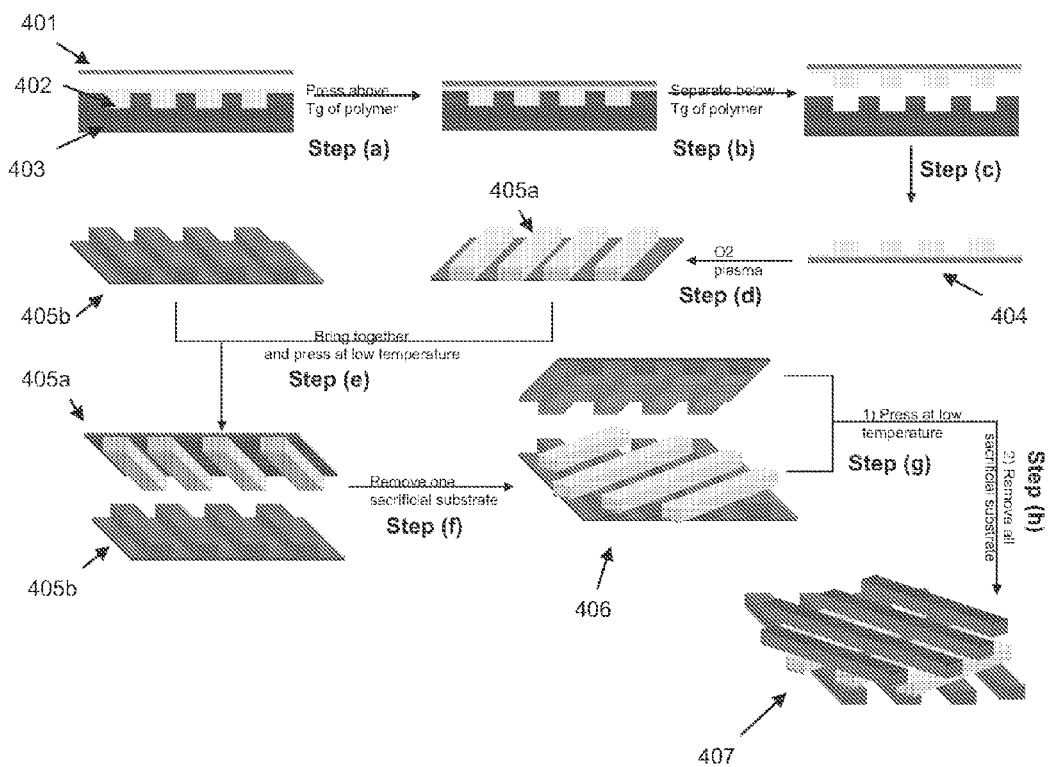
FIG. 4 schematically illustrates fabrication of a sacrificial film-supported or freestanding triple-layer structure, in accordance with an embodiment of the present invention.

An imprinting process in accordance with some embodiments of the present invention is shown schematically in FIG. 1. Referring to FIG. 1, a patterned silicon (Si) mold is treated with a low surface energy silane, for example: 1H,1H,2H,2H-perfluorodecyltrichlorosilane (FDTS), octadecyltrichlorosilane (OTS), or octadecylmethyldichlorosilane (ODS). A polymer solution, for example poly(methyl methacrylate) (PMMA) in, e.g., toluene, is then spin-coated onto the mold such that it fills up the trenches and forms a planarized thin film (FIGS. 1a3 and 1a4). A wafer or glass substrate with high surface energy (FIG. 1a1) can be pressed into the planarized thin film above the glass transition temperature ($T_g$) of the polymer of which the planarized thin film is comprised (FIG. 1b1) and, after a predetermined imprinting time, the wafer or glass substrate can be separated below the $T_g$ of the polymer (FIG. 1e1) and optionally subjected to oxygen ($O_2$) plasma etching to remove residual layer and yield a patterned polymeric film on a wafer or glass substrate (FIG. 1d1). Additionally or alternatively, a sacrificial film or substrate (FIG. 1a2), for instance aluminium foil, is treated with an oxygen plasma to impart it with a high surface energy. This sacrificial film is then pressed, at a suitable pressure, onto the polymer-coated Si mold at a temperature above the $T_g$ of the polymer (FIG. 1b2). After a predetermined imprinting time, the sacrificial film is then separated below the $T_g$ of the polymer, resulting in a pattern transfer from the mold to the sacrificial film (FIG. 1c2). This transfer occurs because of the difference in the surface energies between the mold and the sacrificial film. Since the sacrificial film has a higher surface energy than that of the mold, the polymer film preferentially adheres to the sacrificial film and thus results in the transfer of the polymer film. An $O_2$ plasma etching may then be carried out to remove the residue (residual) layer of the polymer film. This results in residual layer-free pattern on the sacrificial film (FIG. 1d2). With the polymer pattern on the sacrificial substrate, it is possible to carry out the following two processes:

1) The patterned sacrificial film can be pressed at a suitable pressure onto a pre-patterned polymer on a substrate (FIG. 1e1). By removing the sacrificial film, a bilayer structure (FIG. 1f1) can be obtained. This imprinting process can be carried out at an ambient temperature with near 100% yield.

2) Alternatively, the patterned sacrificial film can be pressed at a suitable pressure onto another patterned sacrificial film (FIG. 1e2). A freestanding bilayer structure (FIG. 1f2) is then obtained after removing the sacrificial films. This step can also be carried out at an ambient condition (i.e., temperature), as described above.

The sacrificial film described herein can give a near 100% imprinting yield in nano-imprinting lithography (NIL) processes such that the entire pattern on the sacrificial substrate can be transferred to a target substrate. Low imprinting temperatures can be used in multilayer fabrication process since the sacrificial film can be removed by dissolving in a suitable solution rather than mechanical demolding. In NIL processes, demolding steps generally require a good anti-adhesion property, otherwise low imprinting transfer yields will result. Using a sacrificial film, a freestanding structure can easily be obtained by removing the sacrificial film. Additionally, the same kind of polymer material can be used to fabricate a multilayer structure, since the imprinting temperature can be low and the sacrificial substrate is removed by dissolving instead of demolding.

FIG. 3 schematically illustrates the fabrication of a single-layer freestanding structure, according to an embodiment of the present invention. Referring to FIG. 3, polymer is coated onto a silane-treated mold and a sacrificial substrate with high surface energy is brought into close proximity (Step (a)). The sacrificial substrate is then pressed onto the polymer at a temperature above the $T_g$ of the polymer (Step (b)). Next, the polymer is separated from the mold at a temperature below $T_g$, as shown in Steps (c) and (d). After separation from the mold, the sacrificial substrate 301 can be removed, and this results in a single-layer freestanding structure 305 (Step (e)). The sacrificial film materials can be polymer materials, ceramics and metals. The structure size can also be controlled from the sub-micron level down to nanometers in scale.

In some embodiments, it is also possible to design micro- or nanometer-scale structures that assemble with a three layer structure, as shown in FIG. 4. Referring to FIG. 4, polymer 402 is coated onto a silane-treated mold 403 and a sacrificial substrate 401 is brought into close proximity and then pressed onto the polymer at a temperature above $T_g$ for the polymer (Step (a)). Next, the polymer is separated from the mold at a temperature below $T_g$, as shown in Steps (b) and (c). One such fabricated polymer structure is then $O_2$-plasma etched to remove the residual layer (Step (d)) and form structure 405a. Another such polymer structure (405b) has residual layer without plasma etching. The two structures (405a and 405b), as formed in Step (d), are then brought together and pressed at low temperature (Step (e)). One sacrificial substrate is then selectively removed (Step (f)) without destroying the other sacrificial layer to yield structure 406. The residual layer can be removed by plasma etching and another layer is added (this can be done multiple times), as shown in Step (g). Finally, all sacrificial substrates are removed (Step (h)). The resulting three-layer structure 407 can be fabricated by the same type of material, and this also allows the three-layer structure to be substrate supported or freestanding. It should be recognized by persons of skill in the art that the methods of the present invention can also fabricate more complex structures having more than three layers.

Figure 5:
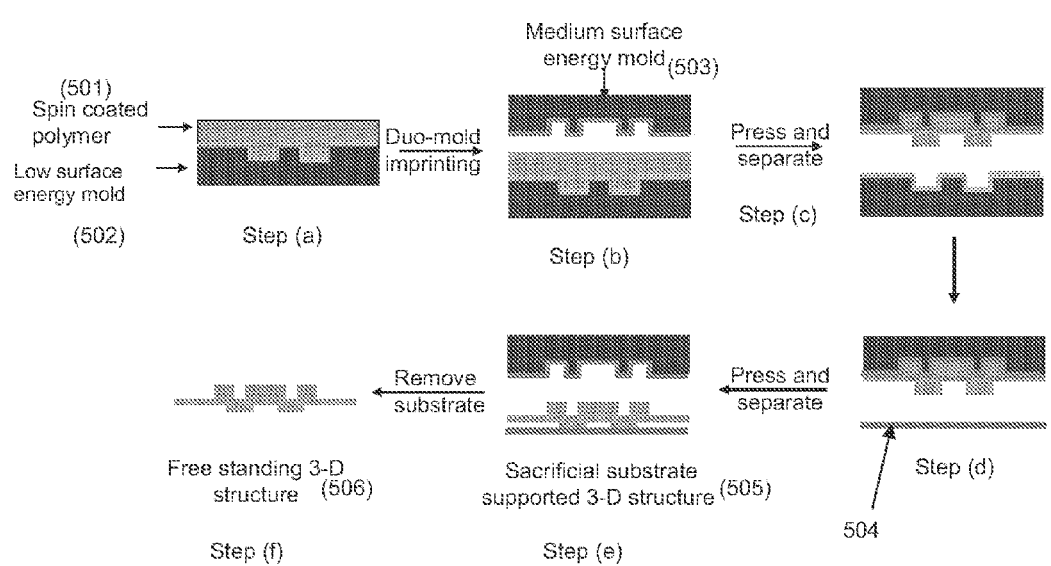
FIG. 5 schematically illustrates the use of a sacrificial film in a duo-mold process to yield a sacrificial film-supported or freestanding 3-D structure, in accordance with an embodiment of the present invention.

In some embodiments, a sacrificial layer is used in combination with a duo-mold imprinting method (U.S. patent application Ser. No. 10/852,448, filed May 24, 2004). Referring to FIG. 5, polymer 501 is spin-coated onto a first mold 502 having low surface energy (e.g., silane-treated), as shown in Step (a). A second mold 503 having medium surface energy is then pressed into the polymer layer above the $T_g$ of the polymer (Step (b)). The molds are then separated at a temperature below $T_g$ and the polymer preferentially adheres to the second mold (Step (c)). The polymer is then pressed and released onto a sacrificial substrate layer 504 (Steps (d) and (e)) to yield sacrificial substrate-supported 3-D structure 505. Finally, if desired, the sacrificial substrate layer 504 can be removed to yield a freestanding 3-D structure 506, as shown in Step (f).

Figure 6:
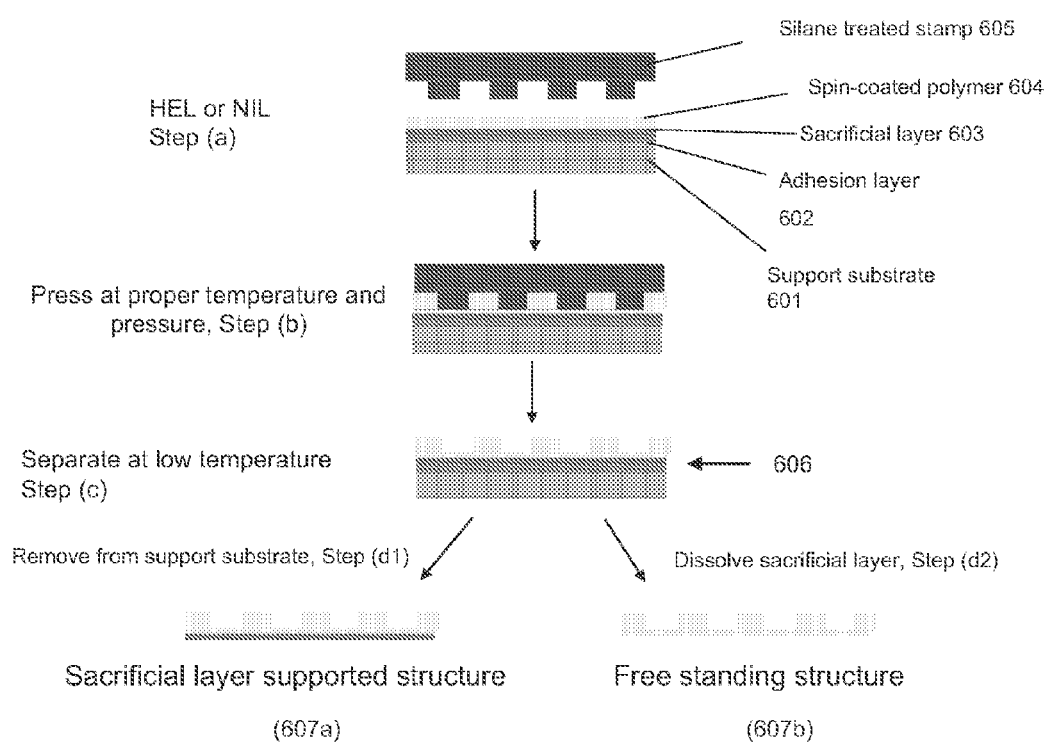
FIG. 6 schematically illustrates the use of a sacrificial film in a HEL or NIL process to yield either a sacrificial layer supported structure or a freestanding structure, in accordance with an embodiment of the present invention.
Figure 8:
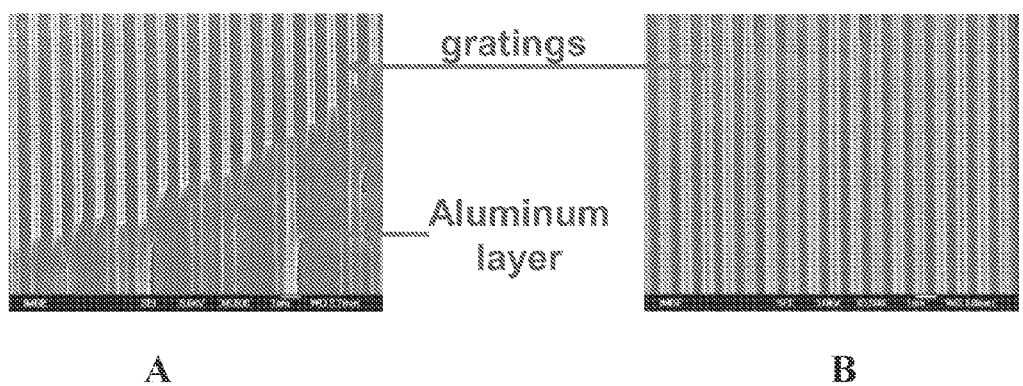
FIGS. 8A and 8B are SEM images depicting samples of 500 nm gratings imprinted by HEL or NIL processes in combination with a sacrificial layer and in accordance with an embodiment of the present invention.

In some embodiments, a sacrificial layer is used in combination with hot-embossing lithography (HEL) or nano-imprinting lithography (NIL). Referring to FIG. 6, an adhesion layer 602 is placed between sacrificial layer 603 and support substrate 601. Polymer 604 is then spin-coated onto sacrificial layer 603, as shown in Step (a). In Step (b), silane treated stamp 605 is pressed into polymer layer 604 at a suitable temperature. Mold 605 is then separated at low temperature (Step (c)) to yield substrate supported structure 606. Support substrate 601 can then be removed to yield a sacrificial layer supported structure 607a (Step (d1)), or the sacrificial layer can be removed to yield a freestanding structure 607b (Step (d2)). FIGS. 8A and 8B illustrate examples of samples imprinted with HEL or NIL used in combination with a sacrificial layer (aluminum), wherein the SEM images depict 500 nm gratings on aluminum.

Figure 7:
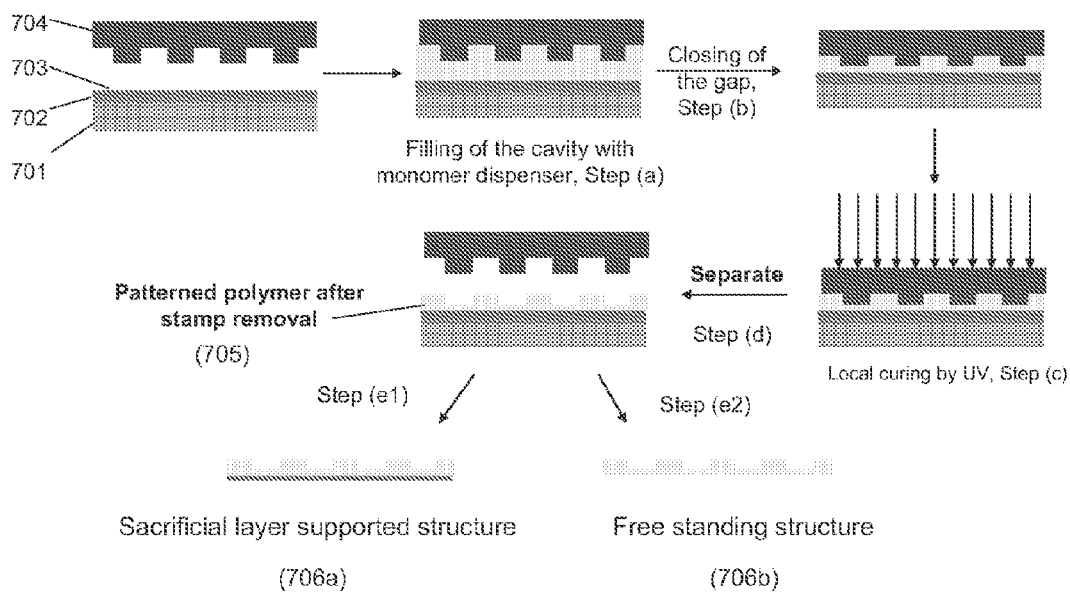
FIG. 7 schematically illustrates the use of a sacrificial film in a MAL or SFIL process to yield either a sacrificial layer supported structure or a freestanding structure, in accordance with an embodiment of the present invention.

In some embodiments, a sacrificial layer is used in combination with mold-assisted lithography (MAL) or step-and-flash imprint lithography (SFIL). Referring to FIG. 7, a cavity is formed between transparent stamp 704 and sacrificial layer 703. Adhesion layer 702 is used to adhere sacrificial layer 703 to support substrate 701. The cavity is then filled with monomer dispenser (Step (a)) and the cavity gap closed (Step (b)). Local curing is done through the transparent stamp 704 by irradiating with ultraviolet light, as shown in Step (c). Stamp 704 is then removed to reveal a patterned polymer structure 705 (Step (d)). Finally, support substrate 701 can be removed to yield a sacrificial layer supported structure 706a (Step (e1)), and sacrificial layer 703 can be removed to yield a freestanding polymer structure 706b (Step (e2)).

It should be mentioned that while aluminum (Al) foil is described herein as a suitable sacrificial substrate, the process and principle described herein can also be applied by using other commercially available materials, such as water soluble polymer sheets, thin ceramic films, and metals such as Zn, Fe or Cu. Likewise, while PMMA has been described as a suitable polymeric material for use in invention embodiments, those of skill in the art will recognize that many other polymeric materials are also suitable. Such suitable polymers include, but are not limited to, poly(lactic acid) (PLA), poly (caprolactone) (PCL), and poly(ethylene terephthalate) (PET).

As noted throughout, a key feature of the present invention is the use of a mechanically conformable and chemically etchable film as a sacrificial component in nanoimprinting and lithographic processes. This sacrificial feature provides an easy, low cost method for increasing the yield of nanopatterning in NIL. Cost and yield are two very important criteria for mass production. Additionally, the present invention fills the need for a NIL process utilizing milder temperatures and pressures.

Potential applications for the structures made by the methods of the present invention include, but are not limited to, micro- and nano-electrical-mechanical systems (MEMS and NEMS devices; e.g., fluidics, actuators, lenses, resonators), sensors, integrated circuit (IC) devices and photonic band gap structures (waveguides).

The following examples are included to demonstrate particular embodiments of the present invention. It should be appreciated by those of skill in the art that the methods disclosed in the examples that follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXAMPLE 1

This Example illustrates the use of a sacrificial layer in an imprinting process, in accordance with an embodiment of the present invention. The various steps described below are correlated with those shown in FIG. 1.

A 7 wt. % PMMA (average Mw≈120 k, Aldrich) in toluene solution is spin-coated at 3000 rpm for 20 seconds onto a Si mold to obtain a planarized coating of around 800 nm in thickness (FIG. 1a4). The PMMA-coated mold is then baked at 80° C. for 5 minutes to remove any remaining solvent in the film. The polished side of a piece of aluminum foil (Diamond Company) (FIG. 1a2) is treated by oxygen plasma at a power of 100 W, a base pressure of 50 mtorr, and a working pressure of 250 mtorr, for 1 minute. The oxygen plasma-treated aluminum foil is then pressed onto the PMMA-coated mold (FIG. 1b2) with a pressure of 40 bars at 150° C. for 5 minutes. The mold is then cooled down to 70° C. and separated. This results in the transfer of the patterned PMMA film from the mold to the aluminium foil (FIG. 1c2). The PMMA-patterned aluminium foil is then treated with an oxygen plasma at a power of 80 W, a base pressure of 35 mtorr, and a working pressure of 150 mtorr, for around 20 seconds, to remove the residual layer (FIG. 1d2).

Separately, a glass substrate is treated with oxygen plasma at a power of 100 W, a base pressure of 50 mtorr, and a working pressure of 250 mtorr, for 5 minutes. The glass substrate is then pressed onto a PMMA-coated mold (FIG. 1a3) with a pressure of 40 bars at 150° C. for 5 minutes. The glass substrate is then cooled and separated, followed by oxygen plasma to remove the residual layer. This results in 500 nm PMMA gratings supported on glass substrate (FIG. 1d1).

Both the glass and aluminium foil supported gratings are brought together perpendicularly, and are pressed with a pressure of 20 bars at 80° C. for 5 minutes, then the substrates are cooled down to 40° C. and separated. The structure is then immersed in a 0.5 M HCl solution for 30 minutes to selectively remove the aluminium foil. This results in a PMMA bilayer scaffold structure on a glass substrate (FIG. 1f1).

EXAMPLE 2

This Example illustrates, in a visual manner, a two-layer PMMA scaffold structure fabricated in accordance with some embodiments of the present invention.

FIG. 2 is a scanning electron micrograph (SEM) image of a two-layer PMMA scaffold structure supported on a glass substrate comprising 500 nm-wide gratings on both the bottom and the top, wherein this structure was fabricated using a method of the present invention. Compared to demonstrated multilayer structures (L. R. Bao, X. Cheng, X. D. Huang, L. J. Guo, S. W. Pang, and A. F. Yee, J. Vac. Sci. Technol. B 20, pp. 2881-2886, 2002; X. D. Huang, L. R. Bao, X. Cheng, L. J. Guo, S. W. Pang, and A. F. Yee, J. Vac. Sci. Technol. B 20(6), pp. 2872-2876, 2002), the top surface of the protrusion of this scaffold is rough. This is due to the rough surface of the sacrificial aluminum film used; dissolving of the sacrificial film will result in a surface with a roughness similar to that of the aluminum foil. However, this rough protrusion surface can be optimized and smoothed by using a well-polished aluminum foil or other sacrificial films and should not be construed as a limitation of this technique.

EXAMPLE 3

This Example illustrates the fabrication of PMMA structures in accordance with invention embodiments. Such structures are similar to those described in EXAMPLE 2 and shown in FIG. 2, but comprise smaller dimensions.

Figure 9:
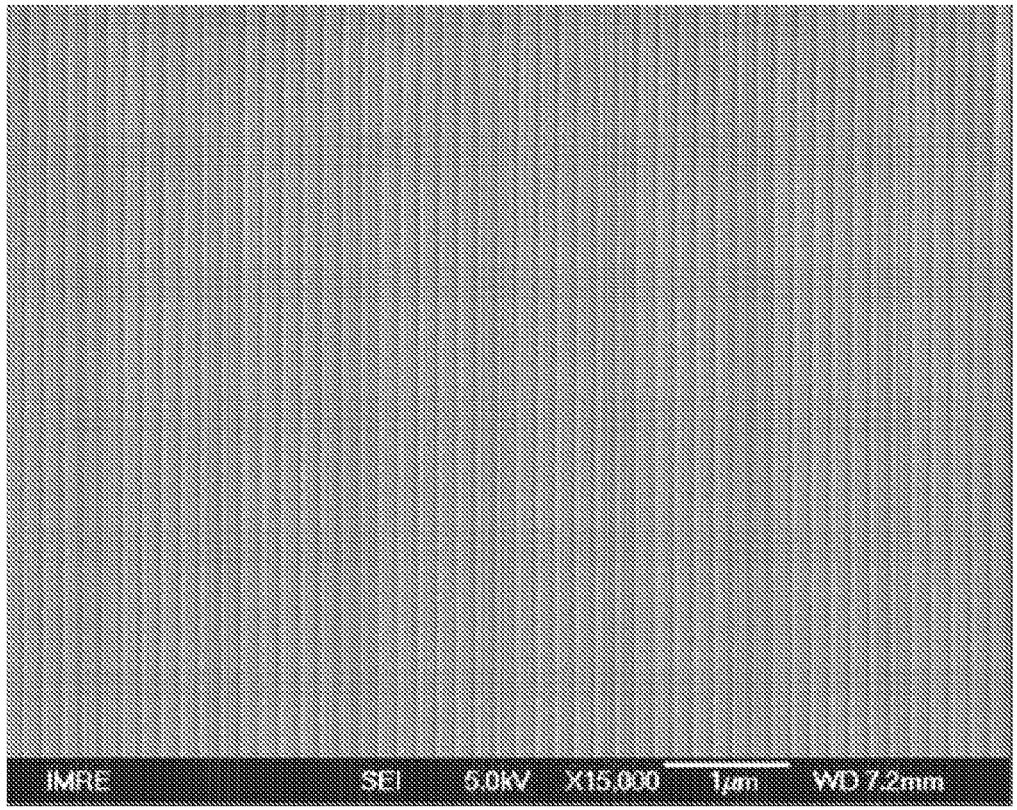
FIG. 9 is an SEM image of a single layer PMMA structure supported on an aluminum foil substrate imprinted by a silicon mold with 75 nm gratings, in accordance with some embodiments of the present invention.
Figure 10:
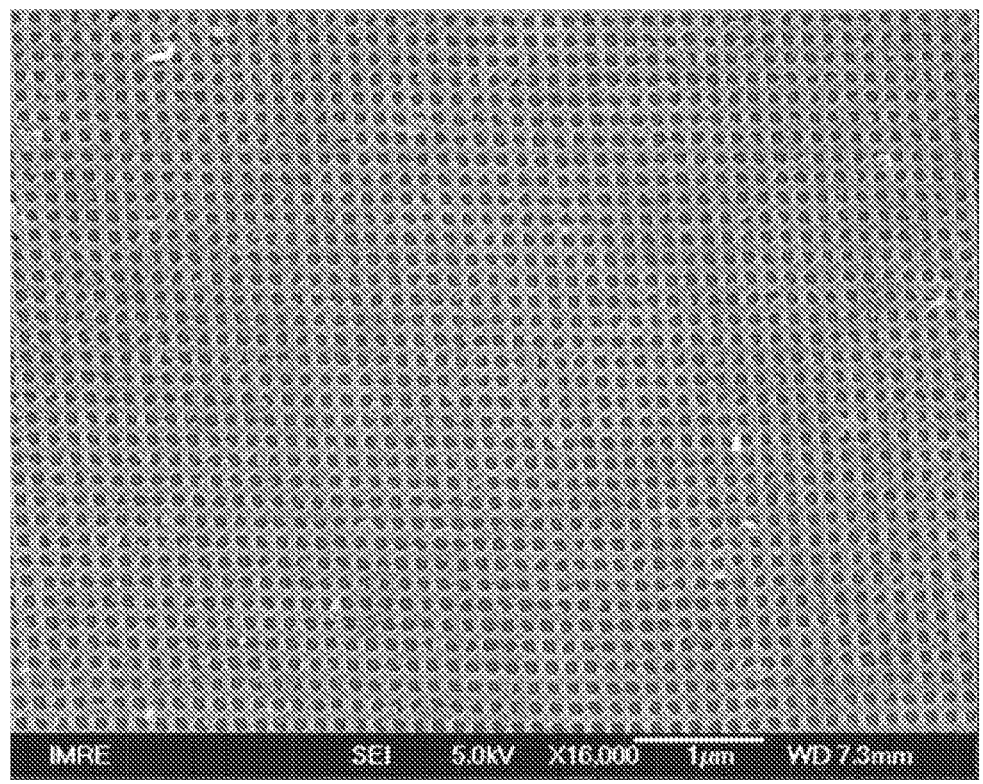
FIG. 10 is an SEM image of a two-layer PMMA scaffold structure supported on aluminum foil imprinted by a silicon mold with 75 nm gratings, in accordance with some embodiments of the present invention.

FIG. 9 is an SEM image of a single layer PMMA grating structure on aluminum foil, the layer fabricated using a silicon mold with 75 nm gratings, in accordance with invention embodiments. Once the Al foil is etched, the 75 nm grating will be a free-standing film. To use the sacrificial film method on conventional NIL, an additional support substrate is used. By extension, scaffold structures with high fidelity have been obtained. FIG. 10 is an SEM image of a scaffold structure with 75 nm gratings. It is worth noting that this scaffold structure with exceedingly small features is fabricated with PMMA, a material that is difficult to structure with other lithographic techniques.

All patents and publications referenced herein are hereby incorporated by reference to the extent not inconsistent herewith. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

The invention claimed is:

1. A method for fabricating a multi-layer structure, the method comprising:
    coating a polymer onto a silane-treated mold;
    pressing a first sacrificial substrate onto said polymer at a temperature above a glass transition temperature for said polymer;
    separating said polymer from said mold at a temperature below said glass transition temperature for said polymer after said first sacrificial substrate was pressed onto said polymer;
    removing a residual layer on said polymer by plasma etching said polymer thereby forming a first structure;
    forming a second polymer structure having a residual layer, wherein a second sacrificial layer is attached to said second polymer structure;
    pressing said first and said second structures together prior to plasma etching said second polymer structure; and
    removing said first sacrificial substrate from said first structure without destroying said second sacrificial layer from said second structure to yield a third structure comprising a three-layer structure.

2. The method as recited in claim 1 further comprising:
    removing a residual layer from said third structure by plasma etching.

3. The method as recited in claim 2 further comprising:
    adding an additional layer to said third structure thereby forming a four-layer structure.

4. The method as recited in claim 1 further comprising:
    removing said residual layer on said polymer by oxygen plasma etching said polymer thereby forming said first structure.

5. A method for fabricating a multi-layer structure, the method comprising:
    treating a patterned silicon mold with silane;
    spin-coating a polymer solution onto said patterned silicon mold in such a manner that said polymer solution fills up trenches of said mold thereby forming a planarized thin film;
    pressing a substrate into said planarized thin film above a glass transition temperature of said polymer solution;
    separating said substrate from said planarized thin film below said glass transition temperature of said polymer solution after a period of time following said pressing of said substrate into said planarized thin film;

pressing a sacrificial film onto a recoated polymer-coated silicon mold at a temperature above said glass transition temperature of said polymer;

separating said sacrificial film from said polymer-coated silicon mold at a temperature below said glass transition temperature of said polymer resulting in a pattern transfer from said mold to said sacrificial film;

removing a residual layer on said polymer by plasma etching said polymer thereby forming a first structure;

pressing said first structure onto a pre-patterned polymer on a second substrate; and removing said sacrificial film from said first structure thereby forming a third structure, wherein said third structure is a multi-layer structure.

6. The method as recited in claim 5, wherein said silane comprises one of the following: 1H,1H,2H,2H-perfluorodecyltrichlorosilan, octadecyltrichlorosilane and octadecylmethyldichlorosilane.

7. The method as recited in claim 5, wherein said polymer solution comprises poly(methyl methacrylate).

8. The method as recited in claim 5, wherein a polymer film of said polymer-coated silicon mold adheres to said sacrificial film.

9. The method as recited in claim 8, wherein said sacrificial film has a higher surface energy than said mold.

10. The method as recited in claim 5 further comprising:
removing said residual layer on said polymer by oxygen plasma etching.

11. The method as recited in claim 5, wherein said substrate comprises a wafer.

12. The method as recited in claim 5, wherein said substrate comprises glass.

13. A method for fabricating a multi-layer structure, the method comprising:
treating a patterned silicon mold with silane;
spin-coating a polymer solution onto said patterned silicon mold in such a manner that said polymer solution fills up trenches of said mold thereby forming a planarized thin film;
pressing a substrate into said planarized thin film above a glass transition temperature of said polymer solution;
separating said substrate from said planarized thin film below said glass transition temperature of said polymer solution after a period of time following said pressing of said substrate into said planarized thin film;
pressing a sacrificial film onto a recoated polymer-coated silicon mold at a temperature above said glass transition temperature of said polymer;
separating said sacrificial film from said polymer-coated silicon mold at a temperature below said glass transition temperature of said polymer resulting in a pattern transfer from said mold to said sacrificial film;
removing a residual layer on said polymer by plasma etching said polymer thereby forming a first structure;
pressing said first structure onto a patterned sacrificial film; and
removing sacrificial films from said first structure and said patterned sacrificial film thereby forming a third structure, wherein said third structure is a multi-layer structure.

14. The method as recited in claim 13, wherein said silane comprises one of the following: 1H,1H,2H,2H-perfluorodecyltrichlorosilan, octadecyltrichlorosilane and octadecylmethyldichlorosilane.

15. The method as recited in claim 13, wherein said polymer solution comprises poly(methyl methacrylate).

16. The method as recited in claim 13, wherein a polymer film of said polymer-coated silicon mold adheres to said sacrificial film.

17. The method as recited in claim 16, wherein said sacrificial film has a higher surface energy than said mold.

18. The method as recited in claim 13 further comprising:
removing said residual layer on said polymer by oxygen plasma etching.

19. The method as recited in claim 13, wherein said substrate comprises a wafer.

20. The method as recited in claim 13, wherein said substrate comprises glass.

* * * * *